US009170004B2

(12) United States Patent
Benoni

(10) Patent No.: US 9,170,004 B2
(45) Date of Patent: Oct. 27, 2015

(54) DEVICE FOR DISPLAYING GRAPHICAL SYMBOLS

(75) Inventor: Andrea Benoni, Cavaion (IT)

(73) Assignee: INTEREL TRADEMARKS B.V., Amsterdam (NL)

( * ) Notice: Subject to any disclaimer, the term of this patent is extended or adjusted under 35 U.S.C. 154(b) by 138 days.

(21) Appl. No.: 14/117,821

(22) PCT Filed: May 10, 2012

(86) PCT No.: PCT/IB2012/052323
§ 371 (c)(1), (2), (4) Date: Feb. 4, 2014

(87) PCT Pub. No.: WO2012/156871
PCT Pub. Date: Nov. 22, 2012

(65) Prior Publication Data

US 2014/0301061 A1 Oct. 9, 2014

(30) Foreign Application Priority Data

May 16, 2011 (IT) .............................. VR2011A0104

(51) Int. Cl.

| | |
|---|---|
| ***G01D 11/28*** | (2006.01) |
| ***F21V 23/04*** | (2006.01) |
| ***F21V 21/00*** | (2006.01) |
| ***F24C 7/08*** | (2006.01) |
| ***G09F 13/04*** | (2006.01) |

(Continued)

(52) U.S. Cl.
CPC ............... *F21V 21/00* (2013.01); *F21V 23/003* (2013.01); *F24C 7/082* (2013.01); *G09F 13/04* (2013.01); *H05K 5/0017* (2013.01)

(58) Field of Classification Search
CPC . F24C 7/082; G09F 13/04; G09F 2013/0427; G09F 13/10; H05K 5/0017; F21V 23/003; F21V 21/02; F21V 21/049; F21V 21/00
USPC .......... 362/23.04, 23.07, 23.11, 23.12, 23.13, 362/23.14, 23.18, 23.19, 23.2, 394, 812
See application file for complete search history.

(56) References Cited

U.S. PATENT DOCUMENTS

| | | | | |
|---|---|---|---|---|
| 4,048,739 A * | 9/1977 | Benton, Jr. | ...................... | 40/579 |
| 5,428,912 A | 7/1995 | Grondal et al. | | |
| 5,542,201 A | 8/1996 | Grondal et al. | | |

(Continued)

FOREIGN PATENT DOCUMENTS

| | | | |
|---|---|---|---|
| CA | 2 506 918 A1 | 11/2006 | |
| DE | 20 2010 010 028 U1 | 10/2010 | |

(Continued)

*Primary Examiner* — Y M Lee
(74) *Attorney, Agent, or Firm* — Pearne & Gordon LLP

(57) ABSTRACT

Described is a device (1) for displaying graphical symbols (2) comprising a screen (3) at least in part transparent on which at least one graphical symbol (2) is delineated and a support panel (5) connected to the screen (3). The support panel (5) has at least one through hole (8). Moreover, the displaying device (1) comprises at least one illumination body (9) emitting a light beam (10) passing through the hole (8) for illuminating the graphical symbol (2) on the screen (3). According to this invention, the illumination body (9) is connected to the support panel (5) at the hole (8). This invention also relates to a control apparatus (100) mounted on a wall (101) comprising a containment box (102), a front frame (111) connected to the containment box (102) and the displaying device (1) connected to the front frame (111).

13 Claims, 5 Drawing Sheets

(51) Int. Cl.

| | |
|---|---|
| ***F21V 23/00*** | (2015.01) |
| ***H05K 5/00*** | (2006.01) |

(56) References Cited

U.S. PATENT DOCUMENTS

| | | | | |
|---|---|---|---|---|
| 6,026,602 | A | 2/2000 | Grondal et al. | |
| 2004/0255497 | A1 * | 12/2004 | Venkataraman et al. ....... | 40/551 |
| 2005/0030764 | A1 | 2/2005 | Spero et al. | |
| 2008/0066357 | A1 | 3/2008 | Spero et al. | |

FOREIGN PATENT DOCUMENTS

| | | | |
|---|---|---|---|
| EP | 0 786 129 | A1 | 7/1997 |
| JP | 2009 186111 | A | 8/2009 |
| JP | 2010 266117 | A | 11/2010 |
| WO | 96/12268 | A1 | 4/1996 |

* cited by examiner

DEVICE FOR DISPLAYING GRAPHICAL SYMBOLS

TECHNICAL FIELD

This invention relates to a display for displaying graphical symbols.

BACKGROUND ART

More specifically, the displaying device is preferably used in wall-mounted control apparatuses for home automation management systems.

These wall-mounted control apparatuses are usually connected to multiple domestic systems (heating, air conditioning, lighting, etc.) and allow the status of these systems to be displayed, using the displaying device, and managed.

Normally, a wall-mounted control apparatus is installed in a housing made (during construction) on a wall, for example of an apartment. More in detail, the control apparatus comprises a containment box which is inserted in the housing and which has an open side and a bottom wall opposite the open side. In other words, the containment box is substantially shaped to match the housing.

Moreover, the displaying device is connected to the box at the open side in such a way as to close the box.

According to the prior art, the displaying devices used comprise a transparent screen (normally made from glass) on which at least one graphical symbol is delineated. Moreover, the displaying devices comprise two electronic cards: a first electronic card, positioned in contact with a rear surface of the screen, and a second electronic card, connected to the first card and spaced from it. The first electronic card also comprises through holes each positioned at a respective graphical symbol of the screen.

The second electronic card is equipped with illumination bodies (preferably LEDs) each generating a beam of light in the direction of a respective hole of the first card.

More specifically, the beam of light, passing through a respective hole, illuminates an area of the screen making the symbols delineated in that area visible on the screen. More in detail, the graphical symbols are visible by observing the screen at a front visible surface (opposite the rear surface). Normally, the symbols are delineated on the screen by xerographics or adhesive films and they represent both word symbols (for example, "C.°", "F.°", "Off", . . . ) and graphics (for example, a fan, a thermometer, . . . ).

In this context, moving an illumination body away from or towards a respective hole enlarges or narrows the illumination area on the screen.

For this reason, in order to illuminate sufficiently large graphical symbols (so as to guarantee a good visibility for the observer) it is necessary to have a sufficiently large area of illumination at the relative graphical symbol.

Therefore, the illumination bodies, and, consequently, the second card, must be adequately spaced from the holes.

More specifically, the distance between the two cards is preferably between 6 millimeters and 20 millimeters depending on the angle of emission of the beam of light by the illumination bodies.

For this reason, according to the pre-set distance between the cards, the displaying device defines an operating region on the screen which comprises all the illumination areas.

However, the prior art technique has several drawbacks.

In effect, the use of two electronic cards set apart from each other creates a predefined dimension in the box of the wall-mounted control equipment. Therefore, the illumination bodies must be positioned at a central area of the box in which the depth (measured from the open side to the bottom wall) is sufficient to house both the cards. More in detail, the depth of the box at the central area must be at least greater than the distance between the two electronic cards.

Consequently, the width of the operating region of the screen is limited by the width of the box (measured on a plane substantially parallel to the bottom wall) at the central area. In other words, the width of the operating region of the screen is substantially limited by the dimensions of the housing made on the wall.

Moreover, the use of two electronic cards set apart from each other creates a predefined dimension in the box of the wall-mounted control equipment thus reducing the volume available for other electronic devices (for example, thermometers, hygrometers, antennas, cables, etc.) which are positioned inside the box. This drawback is accentuated by the fact that the current control needs require the positioning inside the containment box of an ever greater number of electronic devices.

DISCLOSURE OF THE INVENTION

In this situation the aim of this invention is to provide a device for displaying graphical symbols in which the width of the operating region of the screen is independent of the dimensions of the housing made on the wall.

Moreover, another aim of this invention is to provide a device for displaying graphical symbols which has dimensions less than those of the prior art.

The aims indicated are substantially achieved by a device for displaying graphical symbols as described in the appended claims.

BRIEF DESCRIPTION OF THE DRAWINGS

Further characteristic features and advantages of this invention will emerge more clearly from the detailed description of a preferred, but not exclusive embodiment of a device for displaying graphical symbols illustrated in the accompanying drawings, in which.

Figure 1A:
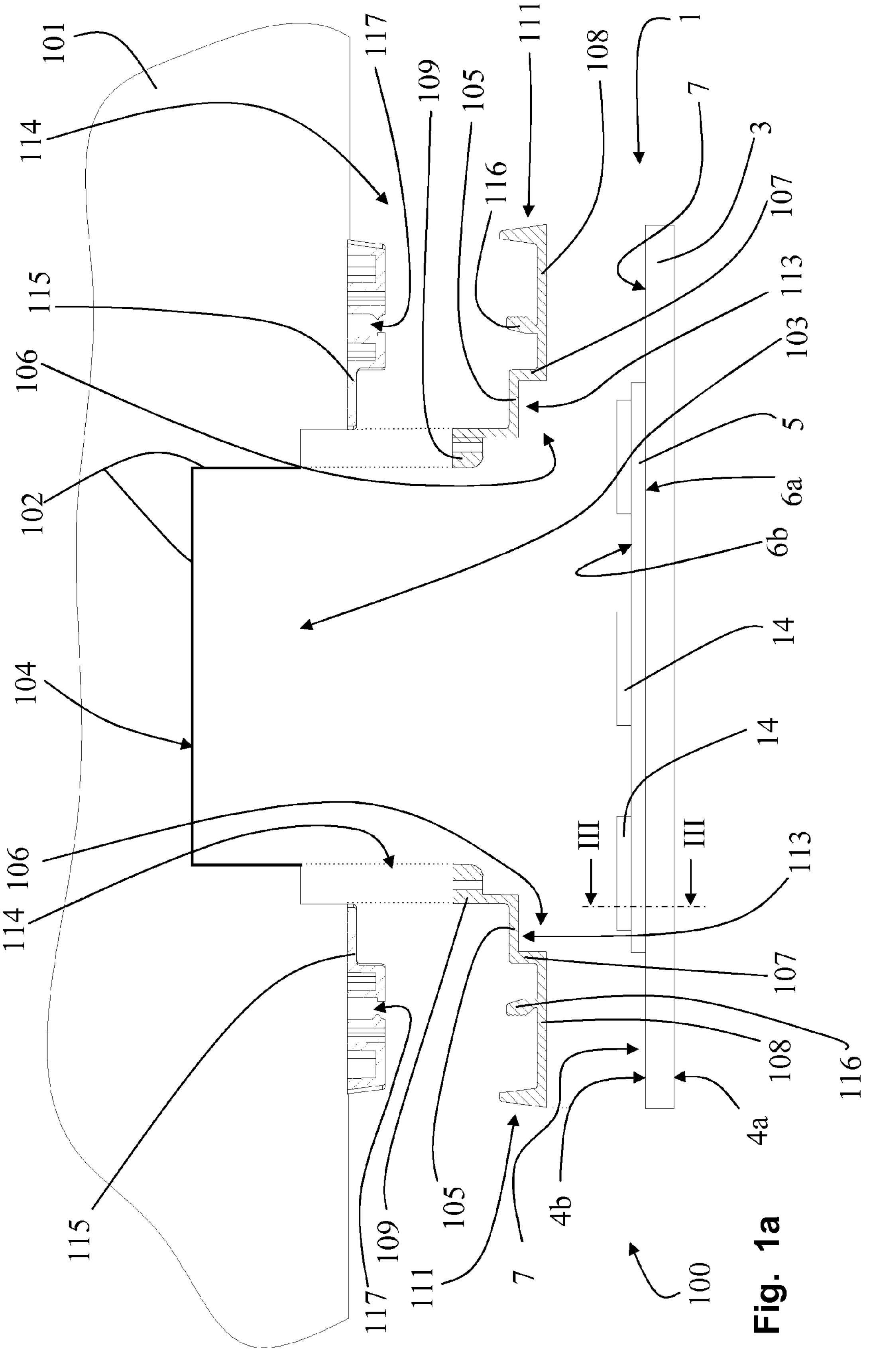
FIG. 1*a* shows an exploded side view of a control apparatus comprising a device for displaying graphical symbols according to this invention with some parts in cross-section.
Figure 1B:
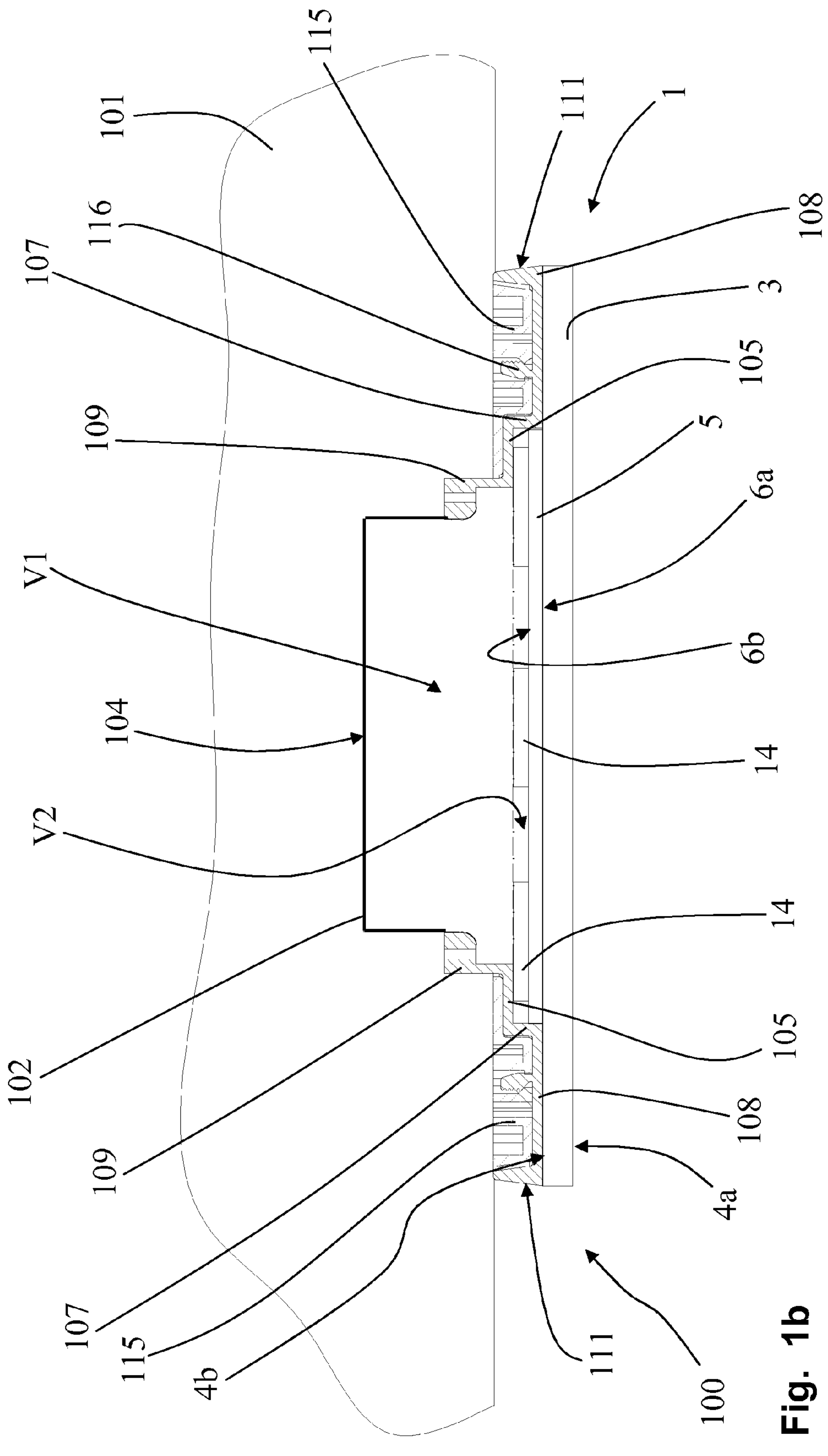
FIG. 1*b* shows a side view of the control apparatus illustrated in FIG. 1*a* assembled.
Figure 2:
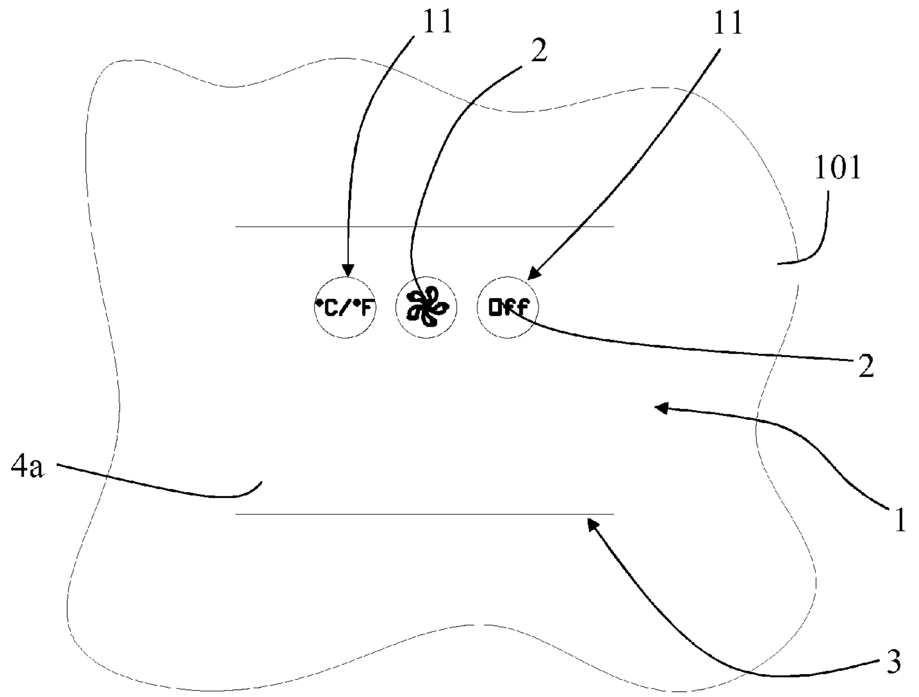
FIG. 2 shows a front view of the control apparatus illustrated in FIG. 1*b;*

With reference to the said figures, the numeral 1 denotes in its entirety a device 2 for displaying graphical symbols according to the present invention.

DETAILED DESCRIPTION OF THE PREFERRED EMBODIMENTS OF THE INVENTION

The displaying device 1 comprises a screen 3 at least in part transparent on which at least one graphical symbol 2 is delineated.

Preferably, the screen 3 is a glass panel. Moreover, the graphical symbols 2 are delineated on the screen 3 by xerographics and/or by pre-cut adhesive films. In detail, a contour line of each graphical symbol 2 is delineated on the screen 3 in such a way as to define an image inside the contour.

More in detail, the screen 3 is at least partly transparent only at the graphical symbols 2. In other words, the screen 3 is non-transparent where the graphical symbols are not delineated 2. In other words again, the screen 3 lets the light pass only at the graphical symbols 2.

Moreover, the screen 3 extends in a single plane and has a visible face 4*a* and a rear face 4*b* opposite the visible face 4*a*. The visible face 4*a* is the face visible by a user. In addition, the rear face 4*b* defines a connection plane. Preferably, the visible face 4*a* and the rear face 4*b* are substantially parallel to each other.

The displaying device 1 also comprises a support panel 5 connected to the screen 3 and having a first surface 6*a* facing the screen 3 and a second surface 6*b* opposite the first surface 6*a*.

Preferably, the support panel 5 is flat and it is substantially parallel to the screen 3. In addition, the first surface 6*a* of the support panel 5 is substantially parallel to the second surface 6*b* of the support panel 5.

Moreover, the support panel 5 is connected to the screen 3 at the first surface 6*a*. More specifically, the first surface 6*a* of the support panel 5 is connected to the rear face 4*b* of the screen 3 along the connection plane.

As shown in FIG. 1*a*, the support panel 5 has a planar extension having dimensions less than the dimensions of the planar extension of the screen 3.

In addition, the support panel 5 is positioned centrally relative to the screen 3. In other words, the screen 3 forms a strip 7 surrounding the support panel 5. The surrounding strip 7 is defined on the rear face 4*b* of the screen 3.

Preferably, the thickness of the screen 3, measured transversely to the connection plane, is between 3 millimeters and 5 millimeters. Preferably, the thickness of the support panel 5, measured transversely to the connection plane, is between 1 millimeter and 2.5 millimeters.

Figure 5:
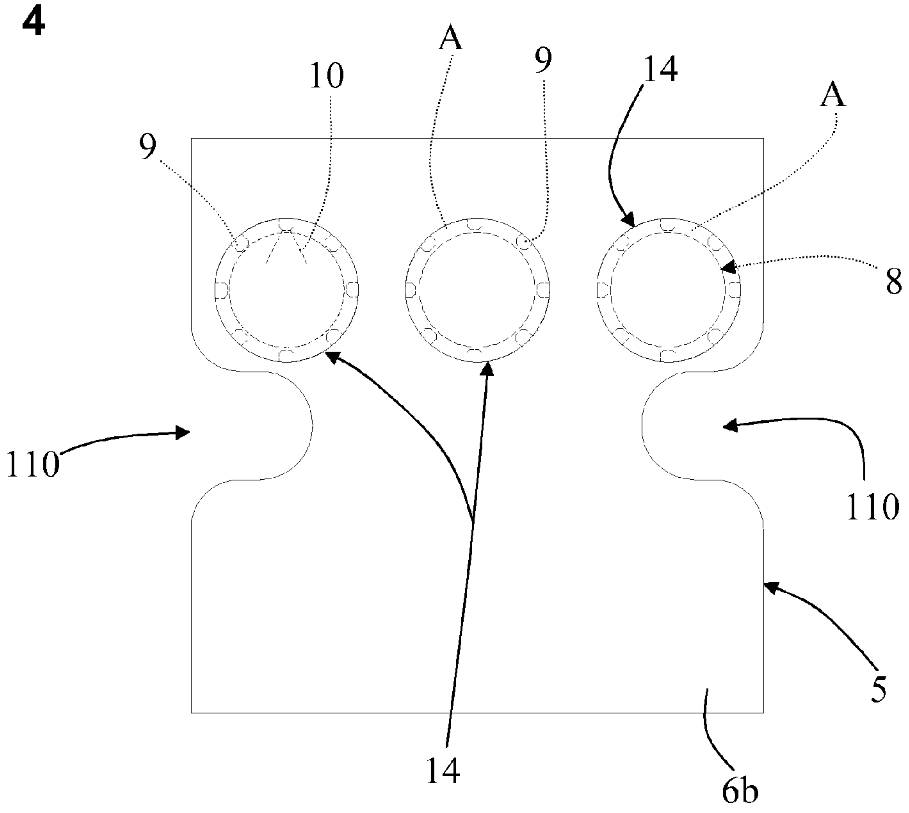
FIG. 5 shows a rear view of a second detail of the displaying device illustrated in FIG. 4 with some parts cut away to better illustrate others.
Figure 6:
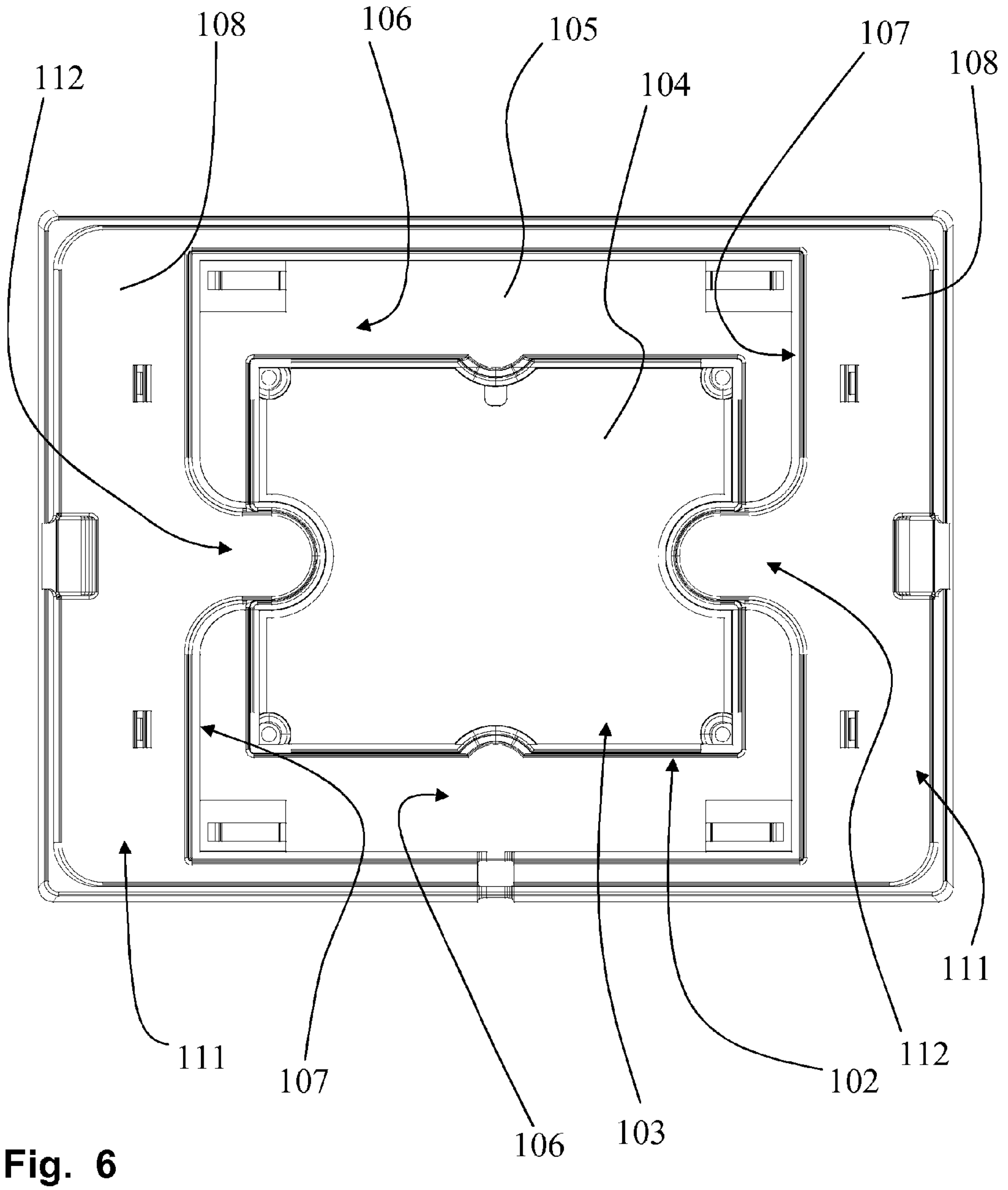
FIG. 6 shows a front view of a third detail of the control apparatus illustrated in FIG. 1*b*.

Moreover, the support panel 5 has at least one hole 8 passing from the second surface 6*b* to the first surface 6*a*. FIG. 5 shows an example of support panel 5 having three through holes 8.

Preferably, each hole 8 defines a circle having a diameter of between 5 millimeters and 50 millimeters.

Moreover, the displaying device 1 comprises at least one illumination body 9 emitting a light beam 10 passing through the hole 8 for illuminating the graphical symbol 2 on the screen 3. In other words, the illuminating body 9 illuminates the screen 3 through the hole 8 for accessing the graphical symbol 2 of interest.

More in detail, the illuminating body 9 illuminates an area of illumination 11 on the screen 3 at a graphical symbol 2. Consequently, the light beam 10 passes where the screen 3 is at least partly transparent and is blocked in the remaining part of illumination area 11 so as to only illuminate the graphical symbol 2.

More specifically, the light beam 10 strikes the screen 3 at the rear face 4*b* of the screen 3 and illuminates the graphical symbol 2 at the visible face 4*a*. In other words, the screen 3 filters the light beam 10 for highlighting a graphical symbol 2 on the visible face 4*a*.

It should be noted that the support panel 5 is interposed between the illumination body 9 and the screen 3. In this way, the light beam 10 passing through the hole 8 delineates the area of illumination 11 on the screen 3.

Preferably, the illumination body 9 comprises a LED. More specifically, the illumination body 9 extends between its emitting portion 12*a* and its supply portion 12*b*. It should be noted that the emitting portion 12*a* of the luminous body faces towards the relative hole 8 so as to emit the light beam 10 in the direction of the hole 8.

According to this invention, the illumination body 9 is connected to the support panel 5 at the hole 8.

More specifically, the second surface 6*b* of the support panel 5 forms a border area A positioned around the hole 8. The illumination body 9 is connected to the border area A of the support panel 5.

Figure 3:
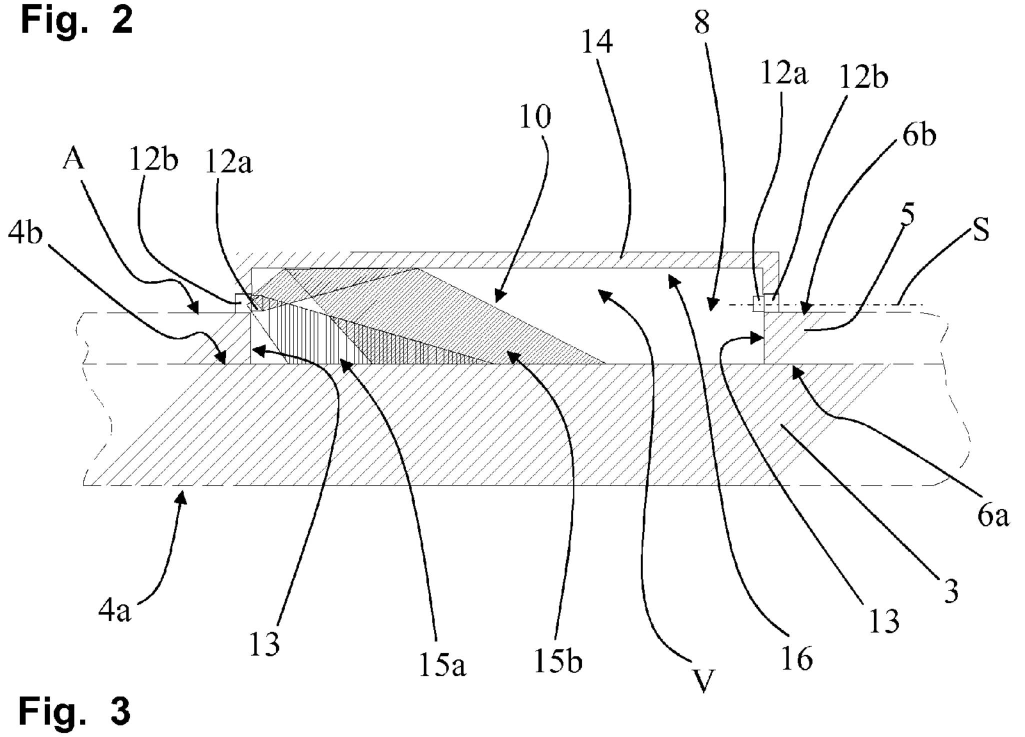
FIG. 3 shows a side view of a first detail of the displaying device illustrated in FIG. 1*a* sectioned along the cross-sectional line III-III.

FIG. 3 shows that the illumination body 9 is connected to the border area A of the support panel 5 at its supply portion 12*b*. More specifically, the emitting portion 12*a* of the illumination body 9 faces the relative hole 8. Yet more specifically, the emitting portion 12*a* of the illumination body 9 protrudes in a cantilever fashion from the relative hole 8.

It should be noted that the illumination body 9 extends along a direction of extension S from the emitting portion 12*a* to the supply portion 12*b*. This direction of extension S of the illumination body 9 is preferably parallel to the connection plane.

Moreover, the displaying device 1 preferably comprises a plurality of illumination bodies 9 positioned at a hole 8. More in detail, the illumination bodies 9 are distributed uniformly around the hole 8. For example, the displaying device 1 in FIG. 5 comprises eight illumination bodies 9 for each hole 8. Each illumination body 9 emits its light beam 10 which generates a respective illumination area 11. The set of illumination areas 11 defines the operating area of the screen 3.

It should be noted that each illumination body 9 emits a light beam 10 having a main direction of propagation substantially parallel to the connection plane. In addition, the angle of opening of the light beam covers at least part of the hole 8. Moreover, the support panel 5 has an annular surface 13 positioned around the hole 8 and between the first surface 6*a* and the second surface 6*b*. The angle of opening of the light beam covers at least part of the annular surface 13. In other words, the illumination body 9 emits a light beam towards a part of the annular surface 13.

The displaying device 1, in accordance with this invention, comprises a shell 14 positioned at the hole 8 and connected to the support panel 5. Preferably, the shell 14 is connected to the second surface 6*b* of the support panel 5.

The illumination body 9 is interposed between the shell 14 and the support panel 5 in such a way that the shell 14 diffuses and/or reflects the light beam 10 towards the hole 8 and thus in the direction of the screen 3.

In other words, the illumination body 9 emits a light beam 10 of which a first part 15*a* passes directly through the hole 8, whilst a second part 15*b* passes through the hole 8 by reflection on the shell 14 (FIG. 3).

Moreover, the shell 14 has an inner surface 16 facing the hole 8. The inner surface 16 of the shell 14 is preferably reflective.

Moreover, the inner surface 16 of the shell 14 has microscopic irregularities which diffuse the light. More in detail, the dimensions of the irregularities of the inner surface 16 of the shell 14 are comparable with the wavelength of the light rays which constitute the beam.

Therefore, in the preferred embodiment the shell 14 reflects and diffuses the light.

Preferably, the shell 14 extends at least for the entire width of the hole 8 and it is positioned alongside the second surface 6*b* of the support panel 5 in such a way as to form an inner space V between the shell 14 and the hole 8.

In other words, the shell 14 closes the hole 8 at the second surface **6*b* of the support panel 5**.

More in detail, the shell 14 is delimited by an outer edge. This edge of the shell 14 is connected to the second surface **6*b* of the support panel 5**.

Moreover, the illumination body 9 operates inside the inner space V. In other words, the illumination body 9 emits the light beam inside the inner space V. In yet other words, the emitting portion **12*a* of the illumination body 9** is positioned inside the inner space V.

Preferably, the support panel 5 has a plurality of holes 8 each positioned at a graphical symbol 2 of the screen 3. Each hole 8 is associated with a respective shell 14.

Figure 4:
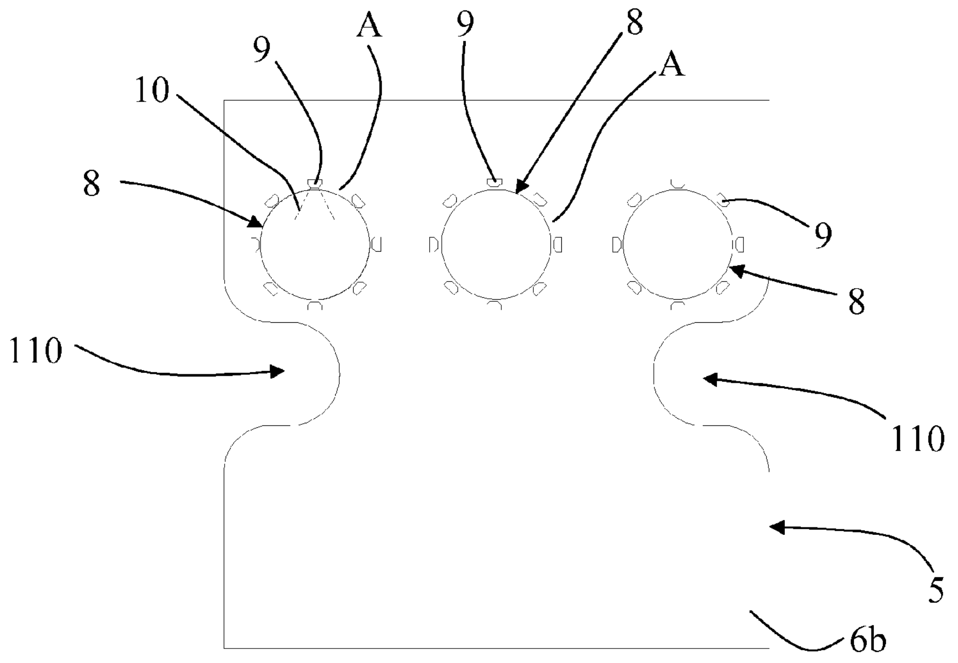
FIG. 4 shows a rear view of a second detail of the displaying device illustrated in FIG. 1*a;*

FIG. 4 shows a plurality of shells 14 wherein each closes a respective hole 8 of the support panel 5 and the illumination bodies 9 are positioned inside each shell 14 (shown by a dotted line in FIG. 4).

More in detail, FIG. 3 shows that the shell 14 at the illumination bodies 9 is connected to the supply portion **12*b***.

Preferably, the support panel 5 comprises an electronic card. Moreover, the displaying device 1 comprises means of electricity supply to the illumination body 9. The electricity supply means are integrated in the electronic card of the support panel 5.

In an alternative embodiment the screen 3 comprises touch selection means associated with the graphical symbols 2. In other words, the screen 3 is of the touch screen type. In that case, the electronic card of the support panel 5 comprises a control unit for reading commands keyed in on the screen 3 and for sending commands to apparatuses connectable to it.

This invention also relates to a control apparatus 100 mounted on a wall 101 comprising a containment box 102 having a front opening 103 and which can be inserted in a housing formed on the wall 101. The containment box 102 also has a bottom wall 104 opposite the front opening 103 and, in use, positioned inside the wall 101. In other words, the containment box 102 extends along a direction of extension from the bottom wall 104 to the front opening 103. The direction of extension of the containment box 102 is substantially transversal to the bottom wall 104 of the containment box 102.

Preferably, the containment box 102 is substantially shaped to match the housing of the wall 101.

Moreover, the control apparatus 100 comprises a front frame 111 connected to the containment box 102 at the front opening 103. More in detail, the front frame 111 extends around the front opening 103 and it is, during use, at least partly superposed on the wall 101.

In addition, the control apparatus 100 comprises a displaying device 1, of the type described previously, wherein the screen 3 is connected to the front frame 111 for closing the front opening 103 in such a way that the screen 3 is on view. In other words, the front frame 111 is interposed between the containment box 102 and the screen 3.

Moreover, the front frame 111 comprises a front portion 108 which extends outside the containment box 102 and the screen 3 is connected on the front portion 108.

According to this invention, the front frame 111 comprises a wide portion 105 extending from the front opening 103 towards the outside of the containment box 102 and, in use, placed upon the wall 101. In other words, the wide portion 105 extends transversely to the direction of extension of the containment box 102. In other words, the wide portion 105 protrudes from the containment box 102.

The front frame 111 forms a perimeter housing 106 between the screen 3 and the wide portion 105 for containing at least part of an illumination body 9 of the displaying device 1. It should be noted that the perimeter housing 106 encircles the front opening of the containment box 102.

Preferably, the wide portion 105 lies on a supporting surface substantially parallel to the bottom wall 104 of the containment box 102.

Preferably, the wide portion 105 has a dimension, measured parallel to the supporting surface, of between 5 millimeters and 20 millimeters.

Moreover, the box comprises a perimeter panel 107 extending substantially transversely to the supporting surface away from the bottom wall 104 of the containment box 102. The perimeter housing 106 is delimited laterally by the perimeter panel 107.

The perimeter panel 107 has a height, measured transversely to the supporting surface, preferably between 2 millimeters and 5 millimeters.

Moreover, the front portion 108 is positioned around the perimeter housing 106. In other words, the front portion 108 defines a frame around the perimeter housing 106.

It should be noted that the front portion 108 of the box lies on a connecting surface on which the screen 3 is connected. The connecting surface is substantially parallel to the supporting surface.

In other words, the containment box 102 defines, internally, a first housing space V1 between the bottom wall 104 and the supporting surface, and a second housing space V2 between the supporting surface and the connecting surface (FIG. **1*a*). Moreover, the second housing space V2 has a width, measured parallel to the connecting surface along a predefined direction, greater than the width, measured parallel to the supporting surface and parallel to the predefined direction, of the first housing space V1. In addition, the second housing space V2 comprises the perimeter housing 106**.

More specifically, the front portion 108 is spaced from the wide portion 105. Yet more specifically, the perimeter panel 107 is interposed between the front portion 108 and the wide portion 105. In other words, the connecting surface is spaced from the supporting surface. Preferably, the distance between the connecting surface and the supporting surface is between 2 millimeters and 5 millimeters.

In other words, the distance between the rear face **4*b* of the screen 3 and the wide portion 105** is between 2 millimeters and 5 millimeters.

Practically, the perimeter housing 106 is comprised between the wide portion 105, the connecting surface and the the perimeter panel 107.

Preferably, the support panel 5 and, at least partly, a shell 14, is positioned in the perimeter housing 106. In other words, the support panel 5, the illumination bodies 9 and the shells 14 are positioned in the second housing space V2 (FIG. **1*b***).

The control apparatus 100 also comprises means 114 of connecting the front frame 111 to the wall 101. The connection means 114 comprise a supporting frame 115 substantially shaped to match the front frame 111 and fixable to the wall 101. More specifically, the supporting frame 115 is interposed between the front frame 111 and the wall 101. Moreover, the supporting frame 115 is fixed to the wall 101 by screws.

In addition, the connection means 114 comprise a plurality of appendages 116 mounted on the front frame 111 and protruding from it in the direction of the supporting frame 115 for fastening the front frame 111 to the supporting frame 115. Moreover, the connection means 14 have slots 117 substantially shaped to mach the appendages 116 in which the appendages 116 are fastened.

Advantageously, the supporting frame 115 is first fixed to the wall 101 and the front frame 111 is then fastened to the supporting frame 115.

The supporting frame 115 also comprises connection portions 109 projecting towards the inside of the containment box 102. In other words, the connection portions 109 face the front opening 103. Advantageously, the connection portions 109 are perforated and allow the supporting frame 115 to be connected to the wall 101 by screws. Correspondingly, the support panel 5 has side portions 110 (FIGS. 4 and 5) substantially shaped to match the connection portions 109 of the containment box 102.

Moreover, the front frame 111 comprises cover portions 112 substantially shaped to match the connection portions 109 and positioned at the connection portions 109 for covering them.

In an alternative embodiment not shown in the accompanying figures, the displaying device 1 does not comprise the shell 14. In the alternative embodiment, the wide portion 105 of the front frame 111 has a reflective surface 113. More specifically, the reflective surface 113 of the front frame 111 faces the illumination body 9 and reflects the light emitted by the illumination body 9 towards the screen 3. Preferably, the reflective surface 113 is formed by a reflective film (for example, coloured white) or by a reflective paint applied to the wide portion 105.

As regards the operation of this invention it may be derived directly from the description above.

More specifically, the device 1 for displaying graphical symbols allows a graphical symbol 2 to be illuminated on the screen 3 by the projection of a light beam 10 by an illumination body 9.

More in detail, the illumination body 9 emits a light beam 10 which partly passes directly through a hole 8 and is partly reflected on the shell 14. Moreover, the shell 14 diffuses the light towards the hole 8.

In addition, the displaying device 1 is mounted on a containment box 102 having a perimeter housing 106 which is placed upon the wall 101. The perimeter housing 106 houses at least one illumination body 9 with a respective shell 14.

Advantageously, the perimeter housing 106 allows widening of the operating region of the screen 3 so as to delineate more graphical symbols 2 on the screen compared with those delineated in the prior art. Moreover, the widening of the operating region of the screen 3 allows larger graphical symbols 2 to be delineated on the screen compared with those delineated in the prior art.

This invention fulfils the preset aims.

More specifically, the width of the operating region of the screen is substantially independent of the dimensions of the housing made on the wall. In effect, it is possible to position an illumination body in an area between the wall and the screen thanks to the small size of the displaying device.

More in detail, the displaying device has reduced dimensions compared with the prior art because the illumination bodies are connected directly to the support panel.

It should also be noted that this invention is relatively easy to produce and that even the cost linked to implementation of the invention is not very high.

The invention claimed is:

1. A device (1) for displaying graphical symbols (2) comprising:

a screen (3) at least in part transparent on which at least one graphical symbol (2) is delineated; the screen (3) comprising touch selection means associated with the graphical symbols (2);

a support panel (5) connected to the screen (3) and having a first surface (6*a*) facing the screen (3) and a second surface (6*b*) opposite the first surface (6*a*); the support panel (5) having at least one hole (8) passing from the second surface (6*b*) to the first surface (6*a*); the second surface (6*b*) of the support panel (5) forming a border area (A) positioned around the hole (8); the support panel (5) comprising an electronic card; the electronic card of the support panel (5) comprising a control unit for reading commands keyed in on the screen (3);

at least one illumination body (9) which emits a light beam (10) passing through the hole (8) to illuminate the graphical symbol (2) on the screen (3); the illumination body (9) extending between its emitting portion (12*a*) and its supply portion (12*b*);

means of electricity supply to the illumination body (9); the electricity supply means being integrated in the electronic card;

wherein the illumination body (9) is connected to the border area (A) of the support panel (5) at its supply portion (12*b*); the emitting portion (12*a*) of the illumination body facing the relative hole (8) and the illumination body (9) extending along a direction of extension (S) from the emitting portion (12*a*) to the supply portion (12*b*).

2. The displaying device (1) according to claim 1 comprising a shell (14) positioned at the hole (8) and connected to the support panel (5); the illumination body (9) being interposed between the shell (14) and the support panel (5) in such a way that the shell (14) diffuses and/or reflects the light beam (10) towards the hole (8) and thus in the direction of the screen (3).

3. The displaying device (1) according to claim 2 wherein the shell (14) extends at least for the entire width of the hole (8) and it is positioned alongside the second surface (6*b*) of the support panel (5) in such a way as to form an inner space (V) between the shell (14) and the hole (8); the illumination body (9) being operative inside the inner space (V).

4. The displaying device (1) according to claim 1, comprising a plurality of illumination bodies (9) positioned at a hole (8); the illumination bodies (9) being distributed uniformly around the hole (8).

5. The displaying device (1) according to claim 1, wherein the illumination body (9) comprises a LED.

6. A control apparatus (100) mounted on a wall (101) comprising a containment box (102) having a front opening (103) and which can be inserted in a housing formed on the wall (101); the control apparatus (100) also comprising a front frame (111) connected to the containment box (102) at the front opening (103);

wherein the control apparatus (100) comprises a displaying device (1) according to claim 1, wherein the screen (3) is connected to the front frame (111) to close the front opening (103) in such a way that the screen (3) is on view; the front frame (111) comprises a front portion (108) which extends outside the containment box (102) and the screen (3) is connected on the front portion (108); the front portion (108) of the front frame (111) being on a connecting surface on which the screen (3) is connected.

7. The control apparatus (100) according to claim 6, wherein the containment box (102) has a bottom wall (104) opposite the front opening (103) and, in use, positioned inside the wall (101); the containment box (102) extending along a direction of extension from the bottom wall (104) to the front opening (103); the direction of extension of the containment box (102) being substantially transversal to the bottom wall (104) of the containment box (102).

8. The control apparatus (100) according to claim 6 wherein the front frame (111) comprises a wide portion (105) extending from the front opening (103) towards the outside of the containment box (102) and, in use, at least in part placed upon the wall (101); the front frame (111) forming a perimeter housing (106) between the screen (3) and the wide portion (105) for containing at least part of an illumination body (9) of the displaying device (1).

9. The control apparatus (100) according to claim 8 wherein the wide portion (105) lies on a supporting surface substantially parallel to the bottom wall (104) of the containment box (102); the front frame (111) comprising a perimeter panel (107) extending substantially transversely to the supporting surface away from the bottom wall (104) of the containment box (102); the perimeter housing (106) being delimited laterally by the perimeter panel (107) and being between the wide portion (105) and the connecting surface.

10. The control apparatus (100) according to claim 9, wherein the containment box (102) defines, internally, a first housing space (V1) between the bottom wall (104) and the supporting surface, and a second housing space (V2) between the supporting surface and the connecting surface; the second housing space (V2) comprising the perimeter housing (106).

11. The control apparatus (100) according to claim 10, wherein the support panel (5), the illumination bodies (9) and the shells (14) of the displaying device (1) are positioned in the second housing space (V2).

12. The control apparatus (100) according to claim 8, wherein the support panel (5) and, at least partly, a shell (14) of the displaying device (1) are positioned in the perimeter housing (106).

13. The control apparatus (100) according to claim 6, comprising means (114) for connecting the front frame (111) to the wall (101); the connection means (114) comprising a supporting frame (115) substantially shaped to match the front frame (111) and fixable to the wall (101).

* * * * *